United States Patent [19]

Shaw et al.

[11] 4,025,793

[45] May 24, 1977

[54] RADIATION DETECTOR WITH IMPROVED ELECTRICAL INTERCONNECTIONS

[75] Inventors: John B. Shaw, Santa Barbara; Peter R. Blatt; Francis I. Gesswein, both of Goleta, all of Calif.

[73] Assignee: Santa Barbara Research Center, Goleta, Calif.

[22] Filed: Oct. 20, 1975

[21] Appl. No.: 623,682

[52] U.S. Cl. .............................. 250/370; 250/338; 250/211 R
[51] Int. Cl.² ........................................ G01J 1/00
[58] Field of Search ............ 357/2, 69; 250/211 R, 250/338, 370

[56] References Cited

UNITED STATES PATENTS

| | | | |
|---|---|---|---|
| 2,131,328 | 9/1938 | Michelssen | 250/212 |
| 2,717,964 | 9/1955 | Parsegian et al. | 250/370 |
| 2,862,126 | 11/1958 | Ploke | 357/2 |
| 3,207,902 | 9/1965 | Sandborg | 250/370 |
| 3,411,048 | 11/1968 | Lepselter | 357/69 |
| 3,452,198 | 6/1969 | White | 250/370 |
| 3,743,995 | 7/1973 | Riedl et al. | 250/370 |
| 3,875,408 | 4/1975 | Pusch | 250/338 |
| 3,886,578 | 5/1975 | Eastwood | 357/69 |
| 3,968,360 | 7/1976 | Monnier | 250/212 |

*Primary Examiner*—Harold A. Dixon
*Attorney, Agent, or Firm*—William J. Bethurum; W. H. MacAllister

[57] ABSTRACT

Disclosed is a radiation sensitive detector element or array and process for fabricating same wherein conductive patterns are formed on both sides of a selected radiation sensitive material. These patterns have aligned openings or discontinuities therein which define the radiation sensitive elements of the array. One of the metallization patterns is bonded via a suitable epoxy material to an insulating substrate material, and the other metallization pattern merges into electrical contact with the one metallization pattern at an electrical contact pad remote from the radiation sensitive material. Therefore, wires may be bonded to the contact pad without exerting pressure on the radiation sensitive material, and a good strong series electrical connection is made to the exposed radiation sensitive material by the one or lower metallization pattern.

5 Claims, 8 Drawing Figures

RADIATION DETECTOR WITH IMPROVED ELECTRICAL INTERCONNECTIONS

FIELD OF THE INVENTION

This invention relates generally to radiation sensitive devices and processes for fabricating same, and more particularly to a photoconductive detector array featuring improved ohmic connections.

BACKGROUND

Photoconductive materials such as mercury cadmimum telluride (HgCdTe) are commonly used in the construction of a plurality of prearranged radiation sensitive elements in a unitary radiation detecting array. The exact size of and spacing between these elements depend upon various considerations such as resolution requirements for the detection system, the desired optical field of view, the detectivity of the particular radiation sensitive material, as well as other parameters known to those skilled in the art of infrared detectors. However, in most, if not all of such detector arrays, the individual radiation sensitive active elements of the array (which are usually arranged in rows and columns) must be electrically connected in series and wire bonded for connection to some external circuitry necessary for either scanning the array or processing signals therefrom. Therefore, the electrical interconnection scheme for the detector array must not only provide a series electrical connection between adjacent radiation sensitive elements, but it must also provide the necessary wire bonding connection to some external electrical circuit.

PRIOR ART

There are at least two commercial prior art approaches known to us for providing a plurality of radiation sensitive elements in a detector array, connecting these elements electrically in series in rows and columns, and then bonding wires to the array for providing the necessary electrical connection to some external electronic circuitry. However, as will be explained in more detail below with reference to the prior art FIGS. 1 and 2, both of these prior approaches have exhibited reliability shortcomings and operational failures which have been overcome by the present invention. These shortcomings and failures have either been caused by material damage produced during electrical bonding to the array, or result from a weak physical connection in the series electrical path for the radiation sensitive elements.

THE INVENTION

The general purpose of the present invention is to provide a novel radiation sensitive detector array and process having all of the significant advantages of the above two prior art detector arrays and related fabrication processes, wile simultaneously eliminating the above described specific shortcoming and disadvantages of these two prior art dectector arrays. To achieve this purpose, we have constructed a radiation sensitive detector assembly and array wherein a first conductive metallization pattern is deposited on one side of a selected photoconductive material and then bonded face down to an insulating substrate. A second conductive metallization pattern is then deposited on the upper surface of the photoconductive material and has openings (or discontinuities) therein which are aligned with openings in the first conductive pattern. Therefore, these openings define two sides of one active element of the detector array. The first and second conductive pattern are merged at a contact pad which is remote from the radiation sensitive photoconductive material, so that good electrical wire bonds can be made to the contact pad without damaging the photoconductive material. At the same time, the first conductive pattern on the underside of the photoconductive material provides a good strong electrical connection to the series connected radiation sensitive active elements of the detector array.

Accordingly, it is an object of the present invention to provide a new and improved radiation detector array and process for fabricating same.

Another object is to provide a radiation detector array of the type described which is not subjected to material damage during either electrical interconnection or wire bonding thereto.

Another object is to provide a radiation detector array of the type described exhibiting good strong electrical interconnections in the series paths of rows and columns of radiation sensitive elements of the array.

A further object of the invention is to provide a radiation detector array of the type described which may be fabricated using a novel combination of material processing steps and techniques which are suitable for use with a wide variety of radiation sensitive materials, such as mercury cadmium telluride or lead tin telluride photoconductors.

These and other objects and features of the invention will become more readily apparent in the following description of the accompanying drawings.

DRAWINGS

FIG. 1 is a perspective view of one prior art detector structure to be described.

FIG. 2 is a perspective view of another prior art detector structure to be described.

FIGS. 3a through 3e illustrate, in sequence, the novel combination of process steps utilized in the fabrication of the novel detector array according to the invention.

FIG. 4 illustrates, in perspective view, the novel detector array according to the invention.

Figure 1:
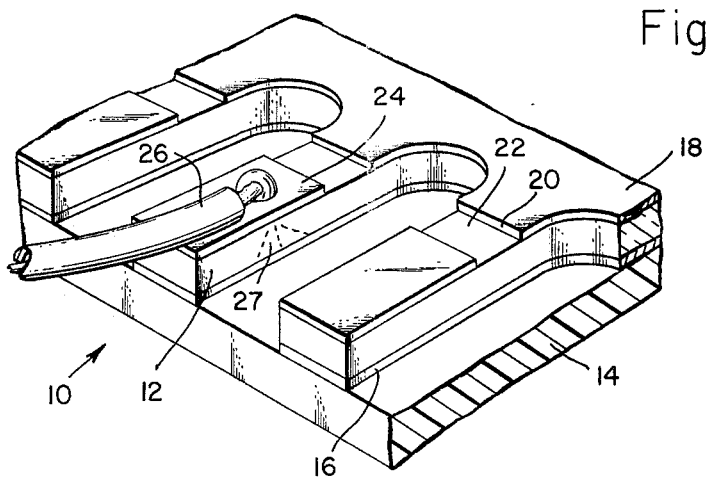
Referring now to FIG. 1, the first prior art detector array to be described is generally designated 10, and includes a plurality of strips 12 of radiation sensitive material which are bonded to a substrate, or wafer 14, by way of an epoxy or other adhesive material 16. An upper contact metallization 18 is deposited on the upper surface of the strips 12 and has been delineated to include a plurality of openings or discontinuities 20 which expose a plurality of detector sensitive areas 22 as shown. The upper contact metallization 18 includes a suitable region 24 for making wire bonds 26 to the detector array.

The main disadvantage characteristic of the detector array shown in FIG. 1 is the bonding damage produced in the areas 27 indicated directly beneath the contact metallization 24 to which the wire bonds 26 are made. Such bonding damage can result in operational degradation or failure of the detector array, and thus various approaches have been taken to avoid this direct wire bonding pressure applied directly to the photoconductive material 12.

Figure 2:
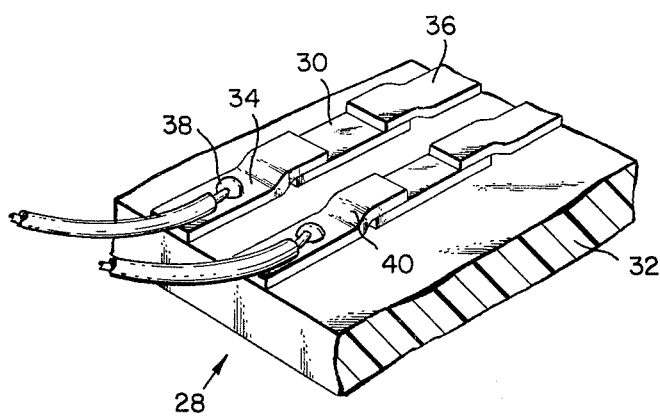

Referring now to FIG. 2, there is shown another prior art infrared detector array which has been constructed to eliminate the direct pressure bonding damage produced in the infrared sensitive material in FIG. 1. The structure 28 in FIG. 2 includes a plurality of individual radiation sensitive elements 30 which are suitably secured to a supporting substrate 32 and which are electrically connected by means of a plurality of contact metallization strips 34 and 36 to other like elements of the array (not shown). The external wire bond connections 38 are made to areas on the metallization strips 34 remote from the detector material 30, so there is not direct bonding pressure to the radiation sensitive material 30 and the above described problem of wire bonding damage in FIG. 1 has been eliminated.

The disadvantage, however, with the interconnection approach utilized in the structure of FIG. 2 is the weakness produced by mechanical stress in the non-planar regions 40 of the contact metallization strips 34 and 36. These regions 40 must ride up over the edges of the detector elements 30 and thus represent a weak mechanical link in the series electrical connection made to a plurality of detector elements 30 arranged in rows and columns on the substrate 32.

Thus, while the prior art detector array structures illustrated above in FIGS. 1 and 2 have proven satisfactory for certain types of infrared detector applications, they have not been totally acceptable for certain other high reliability detector applications which cannot tolerate either of the aforedescribed structural weaknesses in these prior art detector arrays. The device and process according to the present invention, to be described hereinafter, has eliminated both of the above structural weaknesses.

Figure 3A:
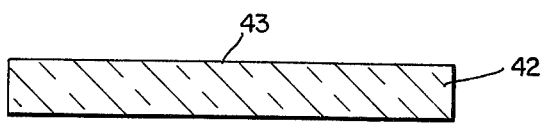
Figure 3B:
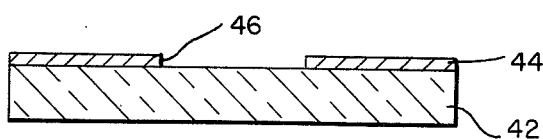

Referring now to FIGS. 3a–3e and the fabrication process embodying the present invention, we initially provide a selected radiation sensitive semiconductor substrate or wafer 42, as shown in FIG. 3a, whose upper surface 43 is initially cleaned and polished using conventional semiconductor processing techniques. Thereafter, a first metallization pattern 44 is deposited, as shown in FIG. 3b, on the planar surface 43 of the wafer 42 using conventional masking and metal evaporation techniques. The first metallization pattern 44 includes an opening 46 therein which will eventually define an active region of the infrared radiation sensitive wafer material 42.

Figure 3C:
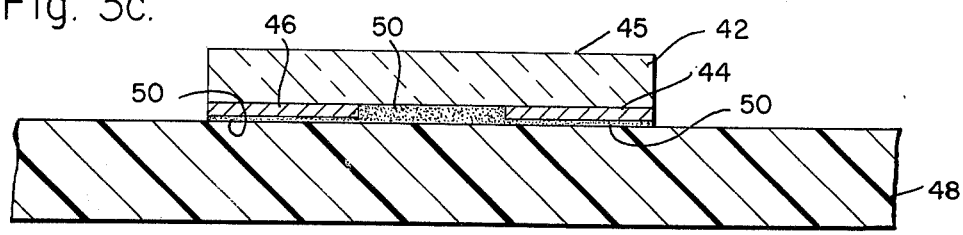
Figure 3D:
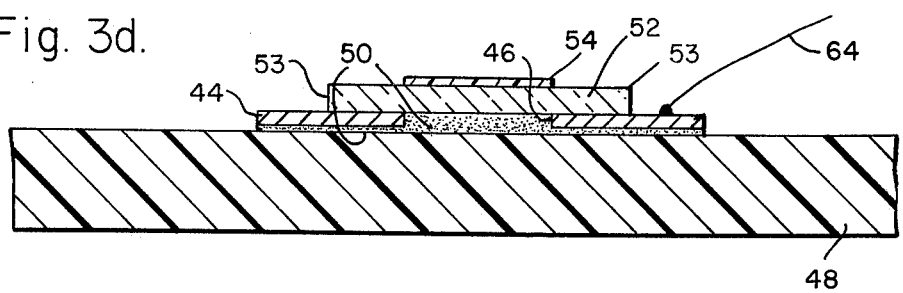
Figure 3E:
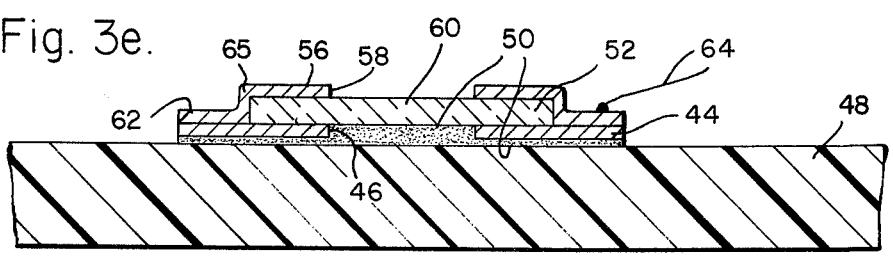

Next, the structure in FIG. 3b is flipped upside down as shown in FIG. 3c and bonded to a suitable supporting substrate member 48, such as sapphire, by means of a bonding material 50, such as an epoxy resin. When the bonding step illustrated in FIG. 3c has been completed, the structure shown therein is transferrred to another semiconductor processing station wherein, initially, the reverse or second surface 45 of the substrate 42 is thinned and further delineated so as to leave a smaller body 52 of infrared detector material, as shown in FIG. 3d. The edges 53 of the semiconductor body 52 are well within the lateral extent of the first conductive pattern 44. A conventional photoresist pattern 54 is then formed as indicated on the upper surface of the detector material 53 and precisely aligned with the opening 46 previously made in the first conductive pattern 44. In this manner, a second conductive metallization pattern 56 can be deposited as shown in FIG. 3e and configured to have an opening 58 therein coextensive with the opening 46 in the first conductive pattern, thereby defining a radiation sensitive active region 60 which may be exposed to incoming infrared radiation. It is to be understood, of course, that this active radiation sensitive region 60 is only one of a large plurality of identical radiation sensitive regions of a larger detector array.

During the above described metal deposition step utilized to form the second conductive pattern 56, the metallization is advantageously deposited to form a contact pad 62 which is remote from the radiation sensitive material 52. Thus, the bonding of electrical wires 64 to the upper metallization pattern 56 as shown does not require the application of pressure to the infrared detector material 52, and thus completely eliminates the bonding damage problem described above with reference to FIG. 1.

At the same time, however, the non-planar region 65 of the second metallization pattern 56 requires no particular mechanical strength, since a strong series electrical connection is made to the radiation sensitive region 60 by the first or lower metallization pattern 44. Thus, it would not make any difference if there was a total break in the bend region of 65 the upper metallization pattern 56, since this metalization layer merely serves to define the lateral active area of the radiation sensitive region 60.

After the step of wire bonding the connection 64 to the contact pad 62, a suitable thin film with selected antireflecting and passivating properties is evaporated over the exposed upper surfaces of wafer 60 in FIG. 3e in accordance with conventional thin film evaporation techniques used in the IR detector fabrication arts.

Athough the structure shown in FIG. 3e is illustrated as a single detector element, it is to be understood that the detector array according to the present invention will usually include a plurality of these radiation sensitive elements 60 connected both in series and in parallel in a larger detector array. The numbers, sizes and spacings of such elements will depend upon factors such as required resolution, field-of-view and other parameters well known to those skilled in the art.

Figure 4:
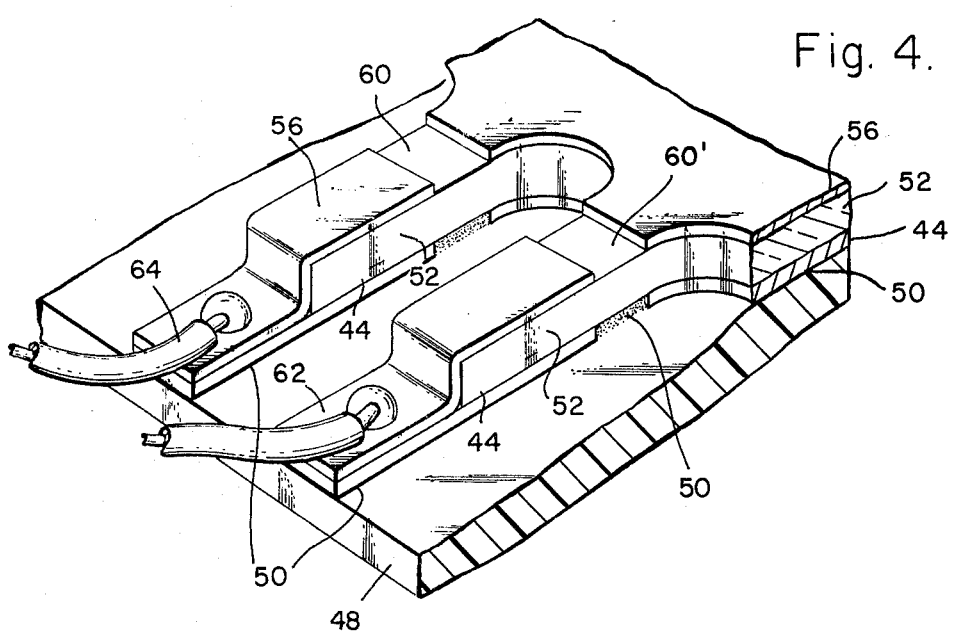

Referring now to FIG. 4, there is shown, in a fragmentary view, one detector array according to the present invention, and the finger-like geometry shown therein for the detector and metal materials is utilized to provide the required physical spacing between adjacent detector elements 60 and 60' of the array. The particular geometrical configuration shown is accomplished utilizing conventinal selective etching processes known to those skilled in the art and which are performed both on the sub-structure shown in FIG. 3b prior to its face down bonding to the substrate 48.

In a preferred embodiment of the invention, the radiation sensitive substrate material 42 is mercury cadmium telluride (HgCdTe), but the array structure described herein is obviously not limited, material wise, to either a particular radiation sensitive material or to the particular metallization, insulation and bonding materials utilized in the total fabrication of the detector array.

What is claimed is:

1. A process for fabricating an infrared detector array comprising the steps of:
    a. depositing a first conductive pattern having at least one opening therein on one of two substantially parallel major planar surfaces of an infrared radiation sensitive substrate,
    b. bonding said first conductive pattern to a suitable support means, c. forming a mask on a second of said two planar surfaces of said infrared sensitive substrate and aligned with said opening in said first conductive pattern; and d. depositing a second conductive pattern on said second planar surface of said infrared radiation sensitive substrate and into electrical contact with said first conductive pattern at a chosen bonding pad location adjacent said substrate, whereby the removal of said mask provides aligned openings in both said first and second conductive patterns which define the active region of said infrared sensitive substrate.

2. The process defined in claim 1 which further includes thinning and delineating said radiation sensitive wafer prior to the formation of said mask thereon, whereby said first conductive pattern extends laterally beyond the thinned substrate and is there available for electrical contacts.

3. The process defined in claim 1 wherein the bonding of said first conductive pattern to a support means includes securing said first conductive pattern to a selected insulating substrate by means of an epoxy resin.

4. The process defined in claim 3 which further includes thinning and delineating said radiation sensitive wafer prior to forming said mask thereon, so that said first conductive pattern extends laterally beyond said radiation sensitive substrate and is there available for electrical contact to both said second metallization pattern and to external electrical contacts.

5. The process defined in claim 4 which further includes bonding wires to a contact pad on said second conductive pattern remote from said radiation senstive substrate.

* * * * *

UNITED STATES PATENT AND TRADEMARK OFFICE
CERTIFICATE OF CORRECTION

PATENT NO. : 4,025,793
DATED : May 24, 1977
INVENTOR(S) : John B. Shaw, Peter R. Bratt, Francis I. Gesswein It is certified that error appears in the above-identified patent and that said Letters Patent are hereby corrected as shown below:

Inventors: Should be --John B. Shaw, Peter R. Bratt, and Francis I. Gesswein-- instead of "John B. Shaw, Peter R. Blatt, and Francis I. Gesswein."

Signed and Sealed this

Eighth Day of November 197

[SEAL]

Attest:

RUTH C. MASON
Attesting Officer

LUTRELLE F. PARKER
Acting Commissioner of Patents and Trademar